United States Patent [19]

Tanaka

[11] Patent Number: 5,438,290
[45] Date of Patent: Aug. 1, 1995

[54] LOW POWER DRIVER CIRCUIT FOR AN AC PLASMA DISPLAY PANEL

[75] Inventor: Akio Tanaka, Tokyo, Japan

[73] Assignee: NEC Corporation, Tokyo, Japan

[21] Appl. No.: 74,081

[22] Filed: Jun. 9, 1993

[30] Foreign Application Priority Data

Jun. 9, 1992 [JP] Japan .................................. 4-149083

[51] Int. Cl.[6] ........................ H03K 1/00; H03K 17/16; G09G 3/10
[52] U.S. Cl. ................................ 327/108; 327/110; 327/111; 327/112; 327/379; 327/381; 327/387; 327/391; 315/169.4
[58] Field of Search ............... 307/270, 246, 570, 571, 307/572, 573, 585, 443, 451; 315/169.1, 169.4; 327/108, 110, 111, 112, 379, 381, 387, 391

[56] References Cited

U.S. PATENT DOCUMENTS 4,692,665  9/1987  Sakuma ........................... 315/169.4
4,866,349  9/1989  Weber et al. ..................... 315/169.4

OTHER PUBLICATIONS

"Energy Recovery Sustain Circuit for the AC Plasma Display", *SID 87 Digest*, 1987, By L. Weber et al., pp. 92–95.

*Primary Examiner*—Timothy P. Callahan
*Assistant Examiner*—Trong Phan
*Attorney, Agent, or Firm*—Young & Thompson

[57] ABSTRACT

The present invention provides a novel energy recovery circuit for an AC plasma display device. The circuit includes a series connection of a load capacitance in a display panel, an inductor to recover most of energies normally lost in charging and discharging the load capacitance and a two way switching device comprising a pair of n-channel MOS transistors connected in series to each other so that a line, on which charging and discharging current flow, includes no diode nor resistive element thereby the circuit is free from any unnecessary parasitic capacitance.

12 Claims, 11 Drawing Sheets

LOW POWER DRIVER CIRCUIT FOR AN AC PLASMA DISPLAY PANEL

BACKGROUND OF THE INVENTION

1. Field of the Invention

The invention relates to a driver circuit for an AC plasma display panel, and more particularly to an energy recovery sustain circuit for driving an AC plasma display panel.

2. Description of the Related Art

It has been required for improvement in the low power consumption to develop a low power driver circuit for driving the AC plasma display device. It has been proposed in the prior arts to use the driver circuit for driving the AC plasma display panel, which includes an inductor to recover the majority of the energy which is normally lost in charging and discharging operations of the panel capacitance and thus the load capacitance. Such an energy recovery function of the inductor is accomplished by a series connection of the inductor and the load capacitor. The conventional energy recovery circuits for driving the AC plasma display circuit is disclosed in SID 87 Digest, pp. 92–95, "Energy Recovery Circuit for the AC Plasma Display".

A typical one of the conventional energy recovery circuit for driving the AC plasma display circuit will be described with reference to FIG. 1. The energy recovery circuit has an inductor L1 which is connected in series to a load capacitor $C_L$ through an output terminal OUT for forming the LC resonance circuit to recover most of the energy which is normally lost in charging and discharging the load capacitor. The load capacitor $C_L$ physically comprises a parasitic capacitance such as line-to-line parasitic capacitance. When the driver circuit driven with a frequency $f_0$ has no inductor, a power of $f_0 \cdot C_L \cdot V_0^2$ is consumed in charging and discharging operations of the load capacitance $C_L$. The output terminal is connected to a high voltage line applied with a voltage $V_0$ through a p-channel MOS transistor MP2 which serves to sustain a $V_0$ output voltage appearing at the output terminal. The output terminal is connected to a ground line taking the ground potential through an n-channel MOS transistor MN2 which serves to sustain the zero output voltage appearing at the output terminal. The inductor L1 is connected at its input side to both an output side of a diode D1 and an input side of a diode D2, both of which are connected to each other. The diode D1 is connected through a p-channel MOS transistor MP1 to a capacitor C1 which has a sufficiently larger capacitance than that of the load capacitor $C_L$. The transistor MP1 serves as a switch for discharging the capacitor C1 and subsequently charging the load capacitor $C_L$. The diode D2 is connected to the capacitor C1 through an n-channel MOS transistor MN1 serving as a switch for discharging the load capacitor $C_L$ and subsequently charging the capacitor C1.

The charging and discharging operations of the conventional energy recovery circuit will be described with reference to FIG. 2 illustrative of wave-forms of the output voltage and the output current at the output terminal and a voltage at the input side N1 of the inductor L1 as well as respective gate voltages of the transistors MP1, MP2, MN1 and MN2. The charging operation and subsequent discharging operation of the load capacitor $C_L$ may be divided into four time durations and thus T1, T2, T3 and T4.

In the time duration T1, the output voltage appearing at the output terminal OUT is raised for conducting the charging operation of the load capacitor $C_L$. The transistor MP1 is applied with a low level signal and then turns ON. The transistor MP2 is applied with a high level signal and then remains in the OFF state. The transistors MN1 and MN2 are applied with a low level signal and then assume the OFF state. Namely, in the time duration T1, only the transistor MP1 takes the ON state and the others take the OFF state and thereby an equivalent LC circuit as illustrated in FIG. 3 is formed. The capacitor C1 then shows the discharge and the discharge current flows through the transistor MP1 and the diode D1. Further, the discharge current flows through the inductor L1 and then appears at the output terminal OUT, resulting in the charge-up operation of the load capacitor $C_L$ which will be completed after the time duration T1. The load capacitor is charged up to the voltage level $V_0$.

The high voltage sustain operation of the load capacitor $C_L$ in the second time duration T2 follows the charging operation of the load capacitor $C_L$ in the first time duration T1. The output voltage $V_0$ appearing at the output terminal OUT is sustained for the second time duration. The transistor MP1 is still applied with a low level signal and then remains in the ON state. The transistor MP2 is applied with a low level signal and then turns ON. The transistor MN1 and MN2 are still applied with a low level signal and then remain in the OFF state. Namely, in the time duration T2, the transistors MP1 and MP2 take the ON state and the others take the OFF state. The voltage $V_0$ is supplied from the high voltage line through the transistor MP2 to the output terminal OUT thereby the output voltage $V_0$ applied to the load capacitor $C_L$ is sustained for the second time duration T2.

In the third time duration, the discharging operation of the load capacitance $C_L$ is performed. The output voltage $V_0$ appearing at the output terminal OUT drops for the third time duration. The transistors MP1 and MP2 are applied with a high level signal and then turn OFF. The transistor MN1 is applied with a high level signal and then turns ON. The transistor MN2 is still applied with a low level signal and then remains in the OFF state. Namely, in the time duration T3, only the transistor MN1 takes the ON state and the others take the OFF state. The load capacitor $C_L$ then shows the discharge and the discharge current from the load capacitor $C_L$ appears and then flows through the inductor L1, the diode D2 and the transistor MN1 into the capacitor C1, resulting in a charge up operation of the capacitor C1. The load capacitor $C_L$ discharges until the output voltage drops to zero voltage.

The zero voltage sustain operation of the output voltage in the fourth time duration T4 follows the discharging operation of the load capacitor $C_L$ in the third time duration T3. The zero output voltage appearing at the output terminal OUT is sustained for the fourth time duration. The transistor MP1 is still applied with a low level signal and then remains in the ON state. The transistors MP1 and MP2 are applied with a high level signal and then remain in the OFF state. The transistor MN1 is still applied with a high level signal and then remains in the ON state. The transistor MN2 is applied with a high level signal and then turns ON. Namely, in the time duration T4, the transistors MN1 and MN2 take the ON state and the others take the OFF state. The ground potential or the zero voltage is supplied from the ground line through the transistor MN2 to the output terminal OUT thereby the zero output voltage applied to the load capacitor $C_L$ is sustained.

As described above, since the charging and discharging currents flow through the inductor $C_L$, the LC resonance circuit operation appears, and thereby the energy recovery effect is obtained. Namely, an energy lost in discharging the capacitor C1 is used to charge up the load capacitor $C_L$. The energy which has been used to charge up the load capacitor $C_L$ is subsequently discharged from the load capacitor $C_L$ and then used to charge up the capacitor C1. That is how the energy recovery is accomplished.

It is of course impossible to recover the exact energy because the transistors MP1 and MN1 serving as the switches as well as the diodes D1 and D2 both have internal resistances through which the charge or the discharge currents flow. It is general that the p-channel MOS transistor has a large ON-resistance as compared to that of the n-channel MOS transistor. The improvement in the efficiency of the energy recovery requires a reduction of the ON-resistance thereof. But the reduction of the resistance of the p-channel MOS requires an enlargement of the pellet size or the chip size which causes the parasitic capacitance between the source and drain to be enlarged. It is difficult to recover an energy lost due to parasitic capacitance in the energy recovery circuit in charging and discharging operations, resulting in a decrease in the efficiency of the energy recovery. That is why the improvement in the efficiency of the energy recovery is physically restricted.

In the current-voltage characteristic, the diodes D1 and D2 are forced to have specific forward bias rise voltages $V_F$ at which the forward current appears and it is increased rapidly in the voltage range more than the $V_F$. The existence of the forward bias rise voltage $V_F$ in the diode causes the energy loss in the charging and discharging operations. Such the energy loss makes the efficiency of the energy recovery inferior. Particularly, such the problem in the inferiority of the efficiency of the energy recovery is considerable when the switching operation takes place at a voltage greater than 100 V because under the above condition a Schottky barrier diode having a relatively small forward bias rise voltage $V_F$ is not usable.

Further, in the prior art, each of the load capacitors and thus the plural pixel capacitors requires the energy recovery circuit when various pulse signals are applied to the pixel electrodes. The conventional driver circuit for the AC plasma display panel is thus expensive.

To settle the above problems, it is required to develop a novel driver circuit for a AC plasma display device.

SUMMARY OF THE INVENTION

Accordingly, it is a primary object of the present invention to provide a novel driver circuit for an AC plasma display device.

It is a further object of the present invention to provide a novel driver circuit for an AC plasma display device, which has an improved high efficiency of energy recovery in charging and discharging pixel capacitors in the plasma display device.

It is a still further object of the present invention to provide a novel driver circuit for an AC plasma display device, which has an extensive low internal resistance for a low power consumption.

It is yet a further object of the present invention to provide a novel driver circuit for an AC plasma display device, which is able to drive a plurality of terminals connecting to pixel capacitors in the plasma display device.

It is another object of the present invention to provide a novel driver circuit for an AC plasma display device, which has a control unit capable of controlling the driver circuit according to a variable number of terminals being driven by the driver circuit for plasma display operation.

The above and other objects, features and advantages of the present invention will be apparent from the following description.

The present invention provides a novel driver circuit for an AC plasma display device. The novel driver circuit includes an output terminal connected to an external load capacitance in the plasma display device for delivering an output of the driver circuit to the load capacitance. The novel driver circuit also includes an AC power supply for supplying an alternating current for charging and discharging the load capacitance. The novel driver circuit also includes a voltage sustaining circuit connected to the output terminal for sustaining voltages appearing at the output terminal. The novel driver circuit also includes an inductor connected in series to the output terminal for recovering most of energies normally lost in charging and discharging the load capacitor. The novel driver circuit also includes a two way switching device connected in series between the AC power supply and the inductor for controlling switching operations in charging and discharging the load capacitance. The switching device comprises only a pair of MOS transistors connected in series to each other. The novel driver circuit comprises a control circuit connected to the two way switching device for controlling the switching operations of the two way switching device. The MOS transistors of the two way switching device comprise n-channel MOS transistor connected in series through those source terminals to each other. The AC power supply comprises a capacitor having a sufficiently large capacitance as compared to the load capacitance. The control circuit comprises a DC power supply connected at its minus side to the capacitor and a CMOS transistor being connected in series between a plus side of the DC power supply and a ground line. The CMOS transistor comprises a pair of p-channel and n-channel MOS transistors connected in series to each other through those drain terminals which are connected to gate terminals of the MOS transistors of the two way switching device.

BRIEF DESCRIPTION OF THE DRAWINGS

Preferred embodiments of the present invention will hereinafter be described in detail with reference to the accompanying drawings.

PREFERRED EMBODIMENTS OF THE INVENTION

The present invention provides a novel energy recovery circuit for an AC plasma display device, which includes a series connection of a load capacitance, an inductor and a two way switching device for switching operation of charging and discharging the load capacitor so that the circuit does not include diodes having a specific forward bias rise voltage $V_F$ which makes it difficult to improve the efficiency of the energy recovery. The two way switching device comprises n-channel MOS transistors only without using a p-channel transistor which has a high ON-resistance as compared to the same size n-channel MOS transistor so that an internal resistance and undesirable parasitic capacitance are reduced. The novel energy recovery circuit connected to a driver integrated circuit for the AC plasma display device is able to drive a plurality of terminals connected to pixel capacitors in a plasma display panel. The novel energy recovery circuit is so controllable by a control logic circuit as to adjust a timing of the switching operations in association with a variable number of terminals required to be driven by various display data.

Figure 1:
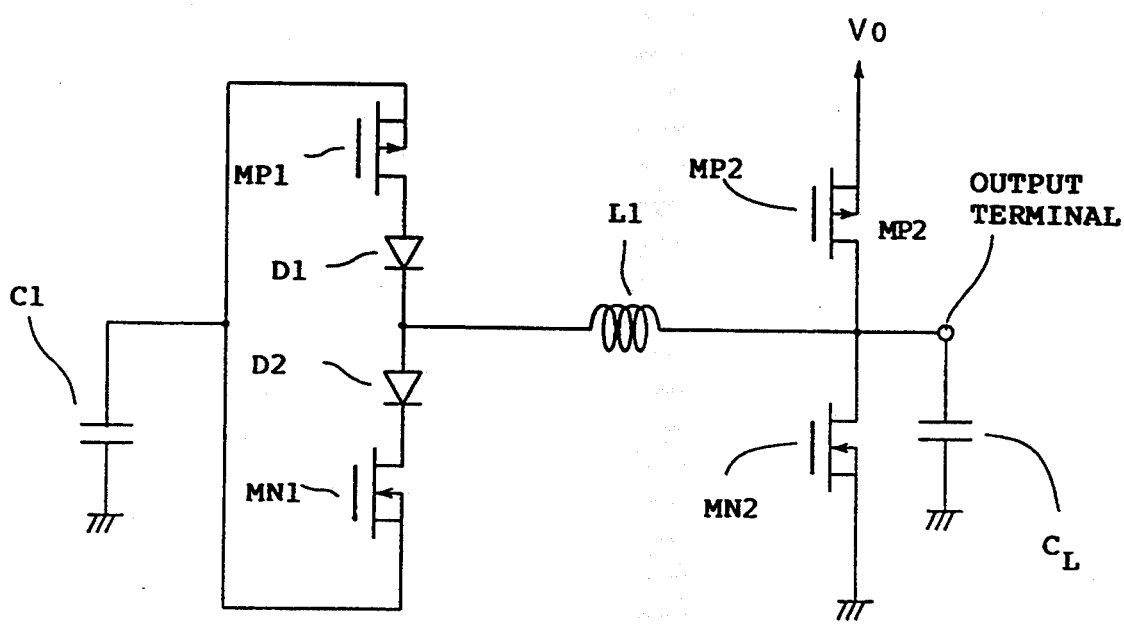
FIG. 1 is a circuit diagram illustrative of the conventional energy recovery driver circuit for the AC plasma display device.
Figure 2:
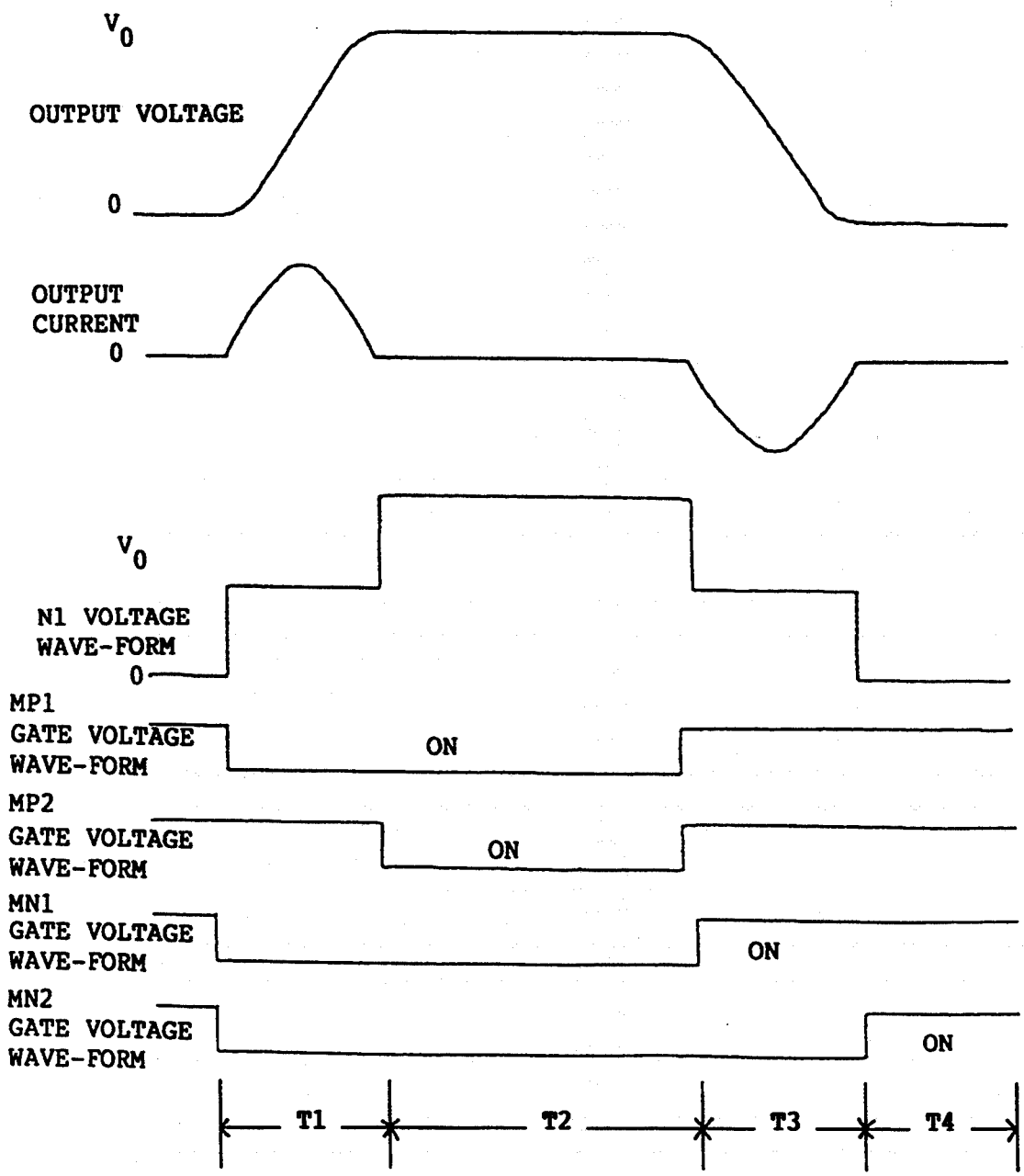
FIG. 2 is a timing charge illustrative of wave-forms of the conventional energy recovery driver circuit for the AC plasma display device illustrated in FIG. 2.
Figure 3:
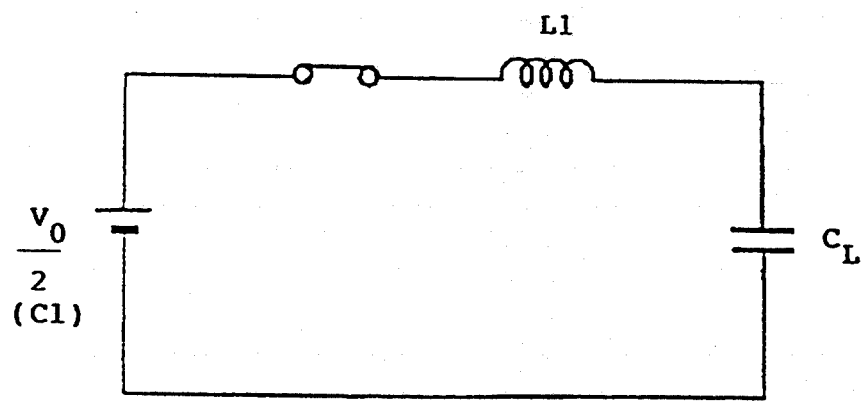
FIG. 3 is a diagram illustrative of the equivalent circuit for describing the operation of the circuit illustrated in FIG. 1.
Figure 4:
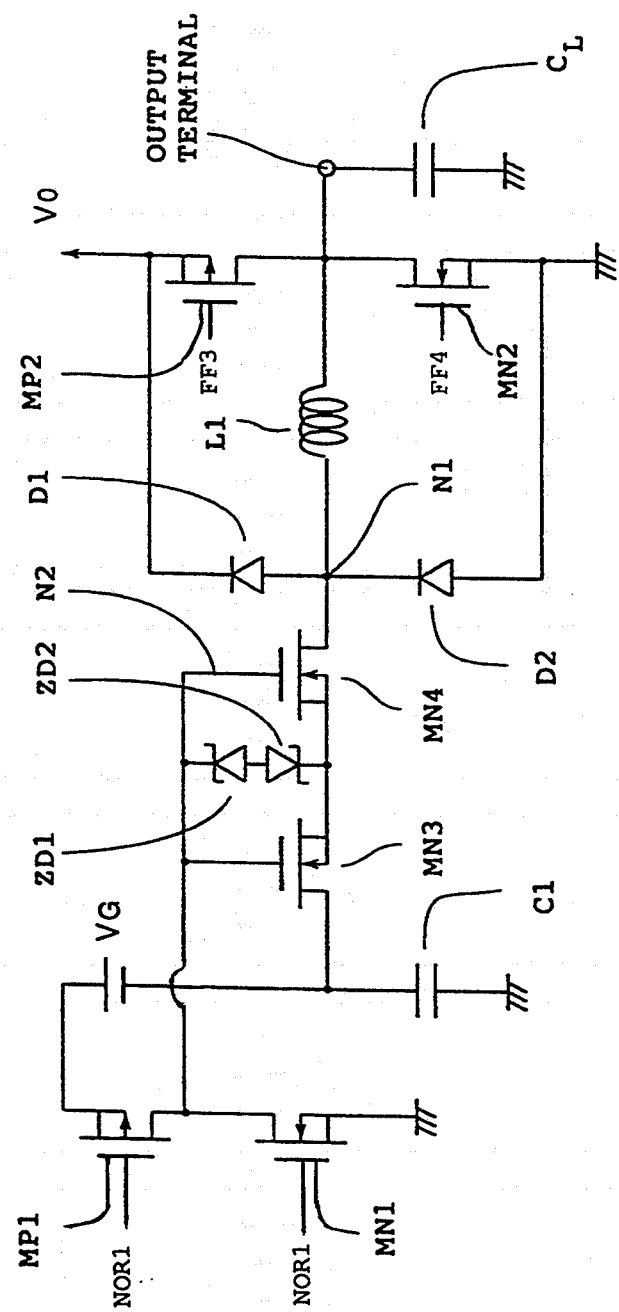
FIG. 4 is a circuit digram illustrative of a novel energy recovery driver circuit for an AC plasma display device in a preferred embodiment according to the present invention.

A preferred embodiment according to the present invention provides a novel energy recovery driver circuit for an AC plasma display device. A circuit configuration of the novel energy recovery circuit provided by the preferred embodiment of the present invention will be described with reference to FIG. 4.

The novel energy recovery driver circuit for the AC plasma display device includes an inductor L1 which is connected in series to a load capacitor $C_L$ through an output terminal OUT for forming the LC resonance circuit to recover most of the energy which is normally lost in charging and discharging the load capacitor $C_L$. The load capacitor $C_L$ is physically regarded as a capacitance made up by a plurality of pixel capacitors in a plasma display panel. The output terminal or the output side of the inductor L1 is connected through a p-channel MOS transistor MP2 to a high voltage line $V_0$. The p-channel MOS transistor MP2 serves as a switching device to sustain a high voltage appearing at the output terminal OUT. The output terminal is connected to a ground line taking the ground potential through an n-channel MOS transistor MN2 which serves as a switching device to sustain the zero output voltage appearing at the output terminal. The inductor L1 is connected at its input side to a point N1 which is connected to the high voltage line through a diode D1 and is also connected to the ground line through a diode D2. The input side of the inductor L1 is connected in series through a two way switching device to a capacitor C1 having a larger capacitance than that of the load capacitor $C_L$ so that the capacitor C1 operates to supply a pulse power for driving the pixel terminals of in the plasma display panel. The two way switching device comprises only a pair of n-channel MOS transistors MN3 and MN4, both of which are connected in series to each other through those source sides and through those gate sides respectively. The source sides and the gate sides of the both n-channel transistors MN3 and MN4 are connected through a pair of Zener diodes ZD1 and ZD2 which are connected in series to each other through those input sides. The transistors MN3 and MN4 are so arranged as to be connected to the inductor L1 and the capacitor C1 respectively. The transistor MN3 is connected to a DC power supply $V_G$ at its minus side. The gates of the transistors MN3 and MN4 are connected through a p-channel MOS transistor MP1 to the DC power supply at its plus side. The gates of the transistors MN3 and MN4 are also connected through an n-channel MOS transistor MN1 to the ground line.

Figure 6:
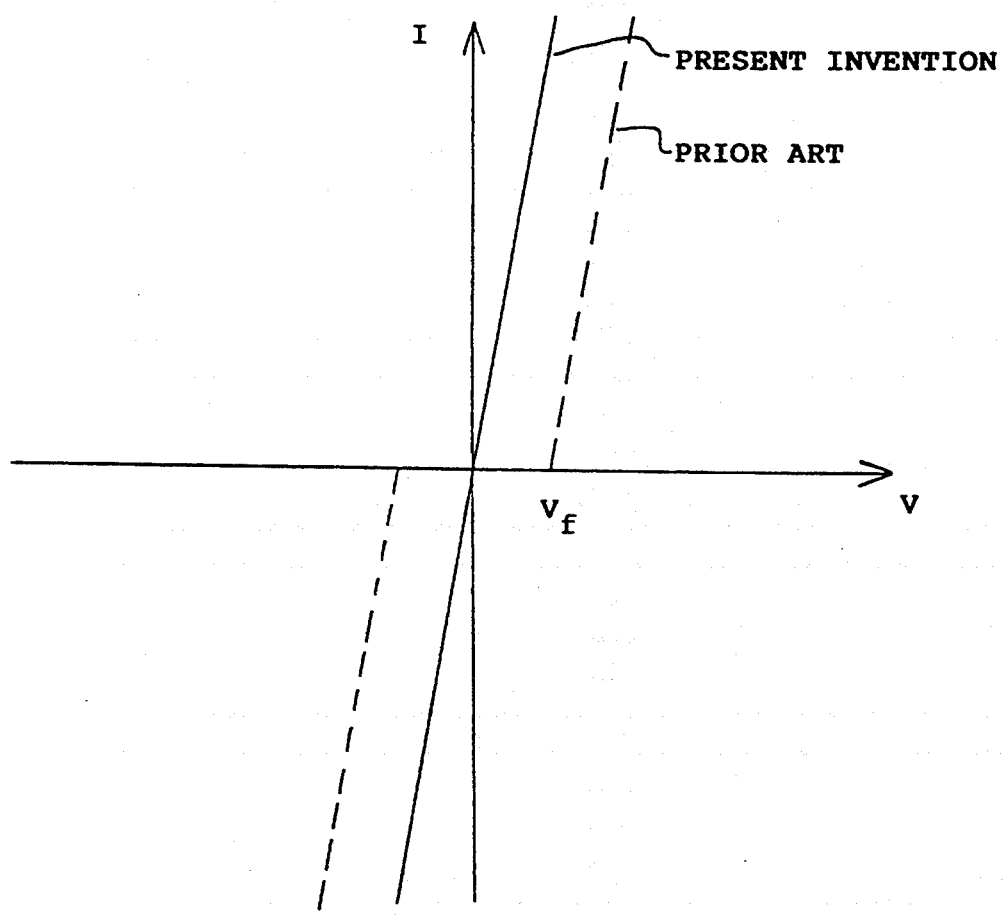
FIG. 6 is a diagram illustrative of current-voltage characteristics of switching transistors involved in a novel energy recovery driver circuit for an AC plasma display device illustrated in FIG. 4.

The pulse current or the alternating current AC1 for charging and discharging the load capacitor $C_L$ flows in the series connection of the inductor L1 and the two way switching device between the capacitor C1 and the load capacitor $C_L$. The line on which the charging and discharging current flows includes one inductor and two n-channel transistors only, and thus does not include diodes nor resistive element nor any element causing parasitic capacitance. The novel energy recovery circuit is therefore free from any energy loss caused by a diode having a forward bias rising voltage or cut-in voltage as illustrated in FIG. 6. The novel energy recovery circuit is also free from any energy loss due to any unnecessary resistance or parasitic capacitance. The transistors MN3 and MN4 making up the two way switching device comprise the n-channel MOS transistors only and thus it includes no p-channel MOS transistor which is required to have a large pellet size as compared to that of the n-channel transistor for a necessary large current flow.

Figure 5:
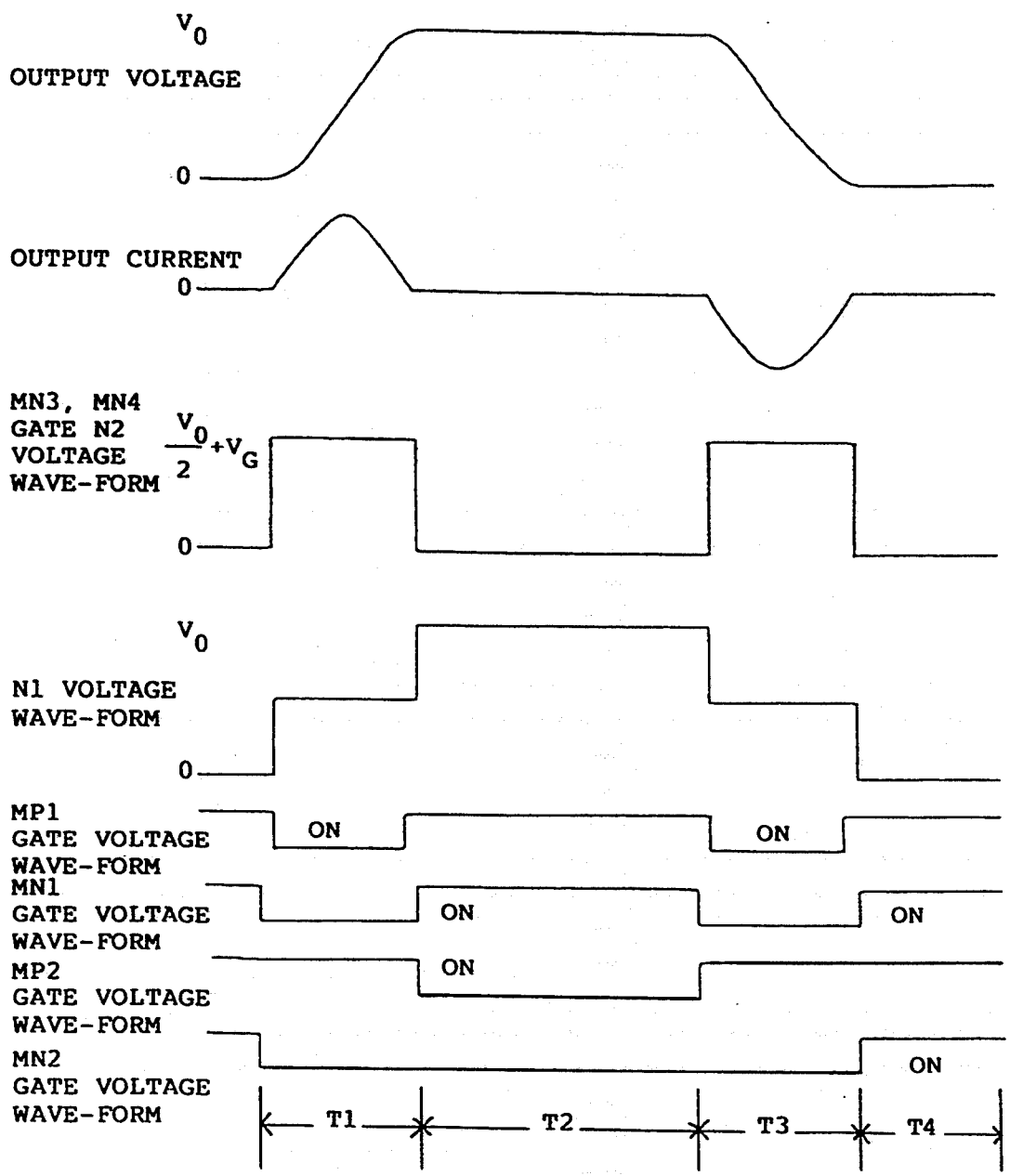
FIG. 5 is a timing charge illustrative of wave-forms of a novel energy recovery driver circuit for an AC plasma display device illustrated in FIG. 4.

The operation of the novel energy recovery circuit in charging and discharging the load capacitor $C_L$ will subsequently be described with reference to FIG. 5. The charging and subsequent discharging operations may be described by diving them into four time durations T1, T2, T3 and T4.

In the first time duration T1, the charging up operation of the load capacitor $C_L$ is accomplished. The n-channel MOS transistor MN1 receives a low level signal and then turns OFF. The p-channel MOS transistor MP1 receives a low level signal and then turns ON thereby the DC power supply $V_G$ and the gates of the transistors MN3 and MN4 are connected. The gates of the n-channel MOS transistors MN3 and MN4 making up the two way switching device are thus applied with a high voltage from the DC power supply $V_G$ so that the two way switching device turns ON. The transistors MP2 and MN2 receive high level and low level signals respectively so that the both turn OFF. The capacitor C1 initiates a discharge operation. The discharge current from the capacitor C1 flows through the two way switching device to the inductor L1 without suffering any energy loss and then appears at the output terminal. The load capacitor $C_L$ subsequently initiates charging operation from a zero voltage up to a high voltage $V_0$. After the output voltage appearing at the output terminal OUT reaches the high voltage $V_0$, the charging up operation of the load capacitor $C_L$ is completed.

In the second time duration T2, the high voltage sustaining operation of the load capacitor $C_L$ is accomplished. The n-channel MOS transistor MN1 receives a high level signal and then turns ON. The p-channel MOS transistor MP1 receives a high level signal and then turns OFF thereby the ground line and the gates of the transistors MN3 and MN4 are connected. The gates of the n-channel MOS transistors MN3 and MN4 making up the two way switching device are thus applied with the ground potential so that the two way switching device turns OFF. The transistors MP2 and MN2 receive low level signals respectively so that the transistor MP2 turns ON but the transistor MN2 remains OFF. The high voltage line and the output terminal are connected to each other so that the high voltage $V_0$ is supplied to the load capacitor which has been charged up to the voltage $V_0$. As a result, the high voltage $V_0$ of the load capacitor and thus of the output terminal is sustained for the second time duration T2.

In the third time duration T3, the discharging operation of the load capacitor $C_L$ is accomplished. The n-channel MOS transistor MN1 receives a low level signal and then turns OFF. The p-channel MOS transistor MP1 receives a low level signal and then turns ON thereby the DC power supply $V_G$ and the gates of the transistors MN3 and MN4 are connected. The gates of the n-channel MOS transistors MN3 and MN4 making up the two way switching device are thus applied with a high voltage from the DC power supply $V_G$ so that the two way switching device turns ON. The transistors MP2 and MN2 receive high level and low level signals respectively so that they both turn OFF. The load capacitor $C_L$ initiates a discharge operation from the high voltage $V_0$ down to the zero voltage. The discharge current from the load capacitor $C_L$ flows through the inductor L1 to the two way switching device without suffering any energy loss and then appears at the output terminal. The capacitor C1 subsequently initiates charging operation. After the output voltage appearing at the output terminal OUT reaches the zero voltage, the discharging operation of the load capacitor $C_L$ is completed.

In the forth time duration T4, the low voltage sustaining operation of the load capacitor $C_L$ is initiated. The n-channel MOS transistor MN1 receives a high level signal and then turns ON. The p-channel MOS transistor MP1 receives a high level signal and then turns OFF thereby the ground line and the gates of the transistors MN3 and MN4 are connected. The gates of the n-channel MOS transistors MN3 and MN4 making up the two way switching device are thus applied with the ground potential so that the two way switching device turns OFF. The transistors MP2 and MN2 receive high level signals respectively so that the transistor MP2 remains OFF but the transistor MN2 turns ON. The ground line and the output terminal are connected to each other so that the ground potential or the zero voltage is supplied to the load capacitor which has been discharged down to the zero voltage. As a result, the zero voltage of the load capacitor $C_L$ and thus of the output terminal is sustained for the fourth time duration T4.

As described above, the charging and discharging currents flow only in the n-channel MOS transistor MN3 and MN4 and the inductor L1 but not through any diode resistive element, or any element causing parasitic capacitance. The novel energy recovery driver circuit for the AC plasma display device is free from any energy loss due to any unnecessary resistance or parasitic capacitance, and therefore the efficiency of the energy recovery is improved considerably.

Figure 7:
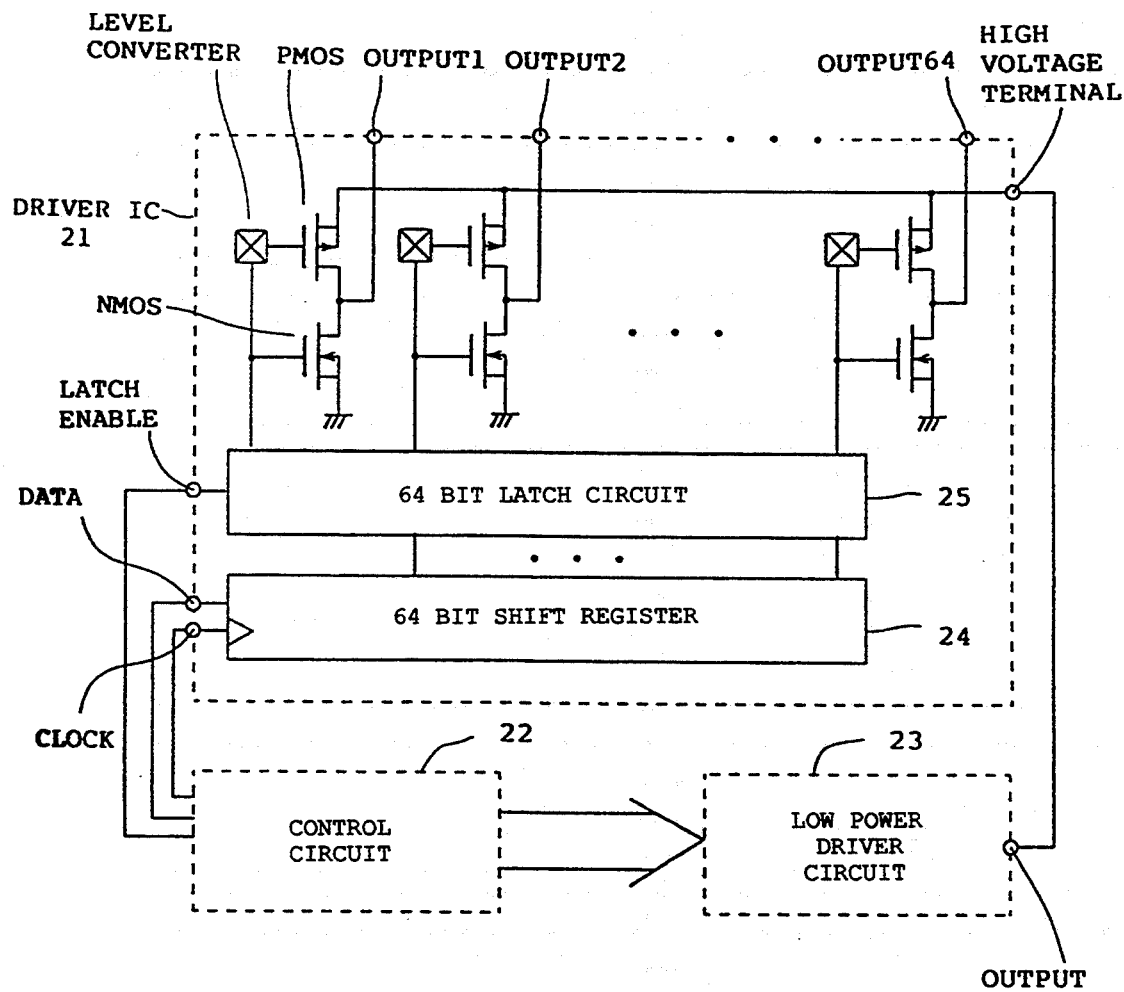
FIG. 7 is a block diagram illustrative of a novel energy recovery driver circuit with a control circuit connected to a driver integrated circuit for an AC plasma display device in a preferred embodiment according to the present invention.

Such novel energy recovery circuit serves as a low power driver circuit for an AC plasma display device. The preferred embodiment of the present invention further provides such a novel circuit connection of the novel energy recovery driver circuit to a driver integrated circuit for driving a plurality of terminals connected to the pixel capacitors involved in the plasma display panel as to allow only a single energy recovery driver circuit to drive the terminals connected to the pixel capacitors in the plasma display panel. The circuit configuration of the novel energy recovery driver circuit and the driver integrated circuit will be described with reference to FIG. 7.

The energy recovery driver circuit operates as a low power driver circuit 23. The output terminal of the low power driver circuit 23 is connected to a high voltage terminal of a driver integrated circuit 21 for the AC plasma display device. The low power driver circuit 23 and the driver integrated circuit 21 are respectively controlled by a control unit 22 which comprises logic circuits. The driver integrated circuit 21 includes a 64 bit latch circuit 25 and a 64 bit shift register 24 which stores data having informations about implementation of driving the plasma display panel. The 64 bit shift register 24 receives both clock and data signals from the control unit 22 comprising the logic circuit. The 64 bit latch circuit 25 receives latch enable signals from the control unit 22.

The driver integrated circuit 21 has sixty four output terminals OUT1 to OUT64 which are respectively connected to sixty four column lines or data lines being connected to the pixel capacitors in the plasma display panel. Each of the switching devices in the driver integrated circuit 21 comprises a pair of a p-channel MOS transistor and an n-channel MOS transistor, both of which are connected in series through those drain sides thereby a CMOS circuit is formed. When the p-channel transistor turns ON, the n-channel transistor turns OFF. If the n-channel transistor turns ON, the p-channel transistor turns OFF. A gate of the n-channel MOS transistor is connected directly to the latch circuit 25. A gate of the p-channel MOS transistor is connected to the latch circuit 25 but through a level converter. A source of the n-channel MOS transistor is grounded. A source of the p-channel MOS transistor is connected to the high voltage terminal which is connected to the output terminal of the low power driver circuit 23. Each of the output terminals OUT1 to OUT64 is connected to the sources of the pair of transistors making up the switching device.

When the gates of the p-channel MOS and n-channel MOS transistors receive a high level signal transmitted from the shift register 24 through the latch circuit 25, the p-channel MOS transistor turns OFF thereby the corresponding output terminal and the high voltage terminal connected to the output terminal of the low power driver circuit 23 are disconnected. But the n-channel MOS transistor turns ON thereby the corresponding output terminal and the ground line are connected. As a result, a zero voltage signal appears at the corresponding output terminal in the driver integrated circuit 21 and then it is transmitted through the data line to the pixel capacitor in the plasma display panel. So the pixel involving the pixel capacitor receiving the zero voltage signal displays no light.

If the gates of the p-channel MOS and n-channel MOS transistors receive a low level signal transmitted from the shift register 24 through the latch circuit 25, the n-channel MOS transistor turns OFF thereby the corresponding output terminal and the ground line are disconnected. But the p-channel MOS transistor turns ON thereby the corresponding output terminal and the high voltage terminal connected to the output terminal of the low power driver circuit 23 are connected. As a result, a high voltage signal is transmitted through the p-channel transistor and then it appears at the corresponding output terminal in the driver integrated circuit 21. Further, the high voltage signal is transmitted through the data line to the pixel capacitor in the plasma display panel. So the pixel of the pixel capacitor receiving the high voltage signal displays light.

Figure 8:
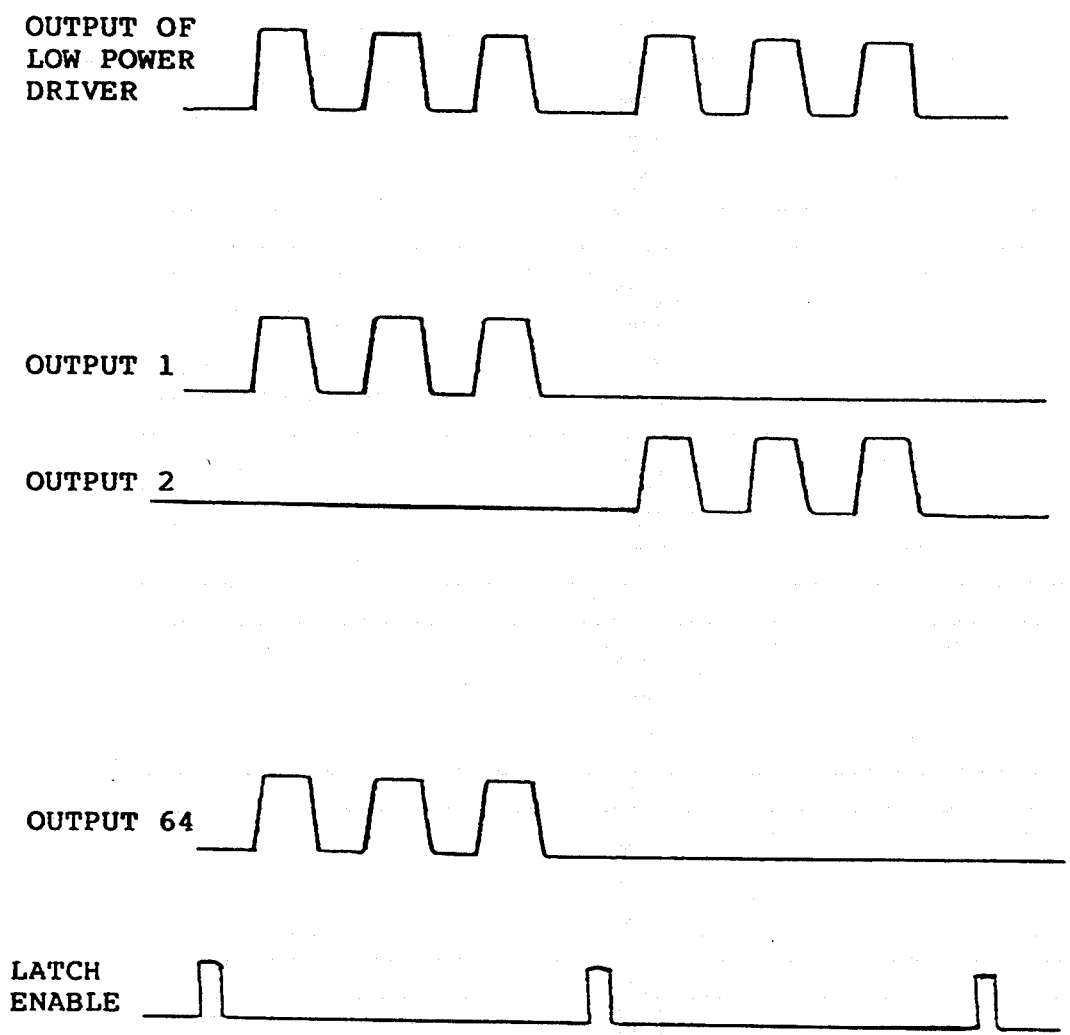
FIG. 8 is a timing charge illustrative of wave-forms of a novel energy recovery driver circuit with a control circuit and a driver integrated circuit for an AC plasma display device illustrated in FIG. 7.
Figure 11:
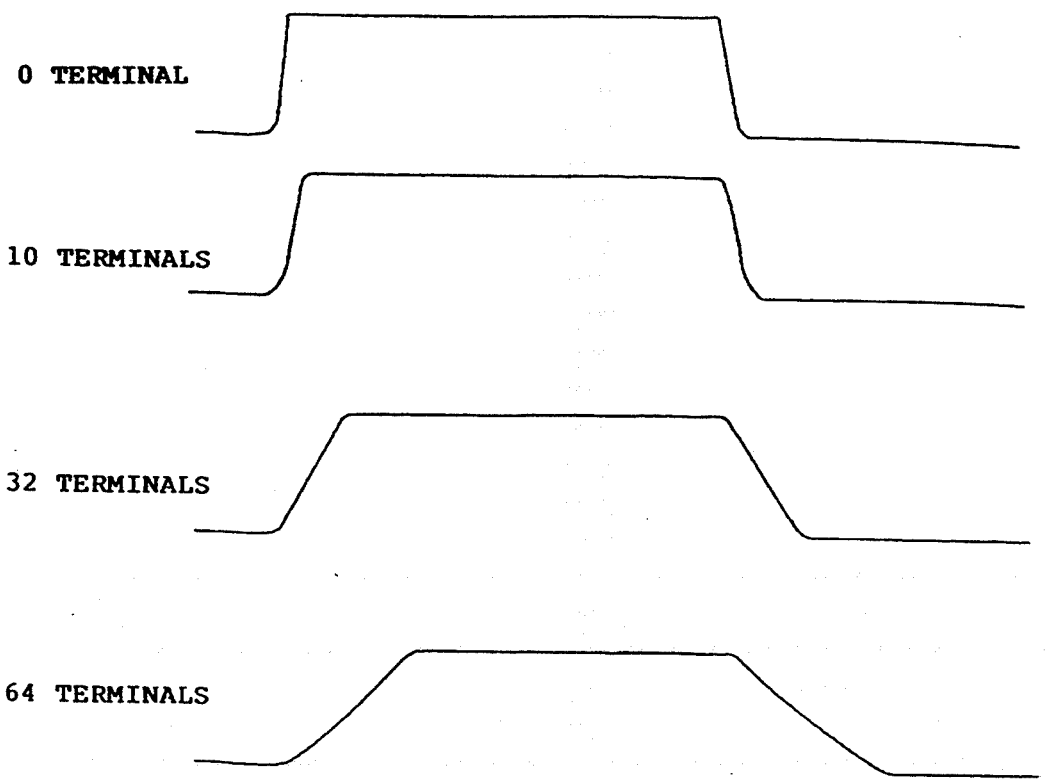
FIG. 11 is a diagram illustrative of wave-forms of output voltage of a novel energy recovery driver circuit for an AC plasma display device.

The output operations of the high voltage signal from the each output terminal in the driver integrated circuit 21 are controlled by timing of the latch enable signal. The timing chart thereof is illustrated in FIG. 8. What output terminals are applied with the high voltage signal from the low power driver circuit 23 is variable on condition of the display pattern. Namely, the number of output terminals applied with the high voltage signal from the low power driver circuit 23 is variable. As illustrated in FIG. 11, if a large number of the output terminals are applied with the high voltage signal from the low power driver circuit 23, the number of the pixel capacitors involved in the plasma display panel is also large. The load capacitance made up by the selected pixel capacitors is thus large. As a result, the wave-form of the output voltage appearing at the output terminal of the low power driver circuit 23 has a relatively long voltage rising time. Namely, the rise of the output voltage of the low power driver circuit 23 is relatively slow. In contrast, a small number of the output terminals are applied with the high voltage signal from the low power driver circuit 23, the number of the pixel capacitors involved in the plasma display panel is also small. The load capacitance made up by the selected pixel capacitors is thus small. As a result, the wave-form of the output voltage appearing at the output terminal of the low power driver circuit 23 has a relatively short voltage rising time. Namely, the rise of the output voltage of the low power driver circuit 23 is relatively rapid. Similarly, the voltage falling time of the output voltage of the low power driver circuit 23 is also variable due to the above causes.

It is thus necessary for accomplishment of proper switching operations to compensate the variation of the voltage rising or falling time of the output voltage of the low power driver circuit 23. The control unit comprising the logic circuit controls both the driver integrated circuit 21 and the low power drive circuit 23 so that the output timing of the output voltage from the low power driver circuit 23 is controlled according to the number of the selected output terminals. As described above, the rising or falling time of the output voltage from the low power driver circuit 23 is associated with the number of selected output terminals in the driver integrated circuit 21. The control unit 22 comprising the logic circuit determines the output timing of the low power driver circuit by replacing the number of the selected output terminals in the driver integrated circuit by the above output timing.

Figure 9:
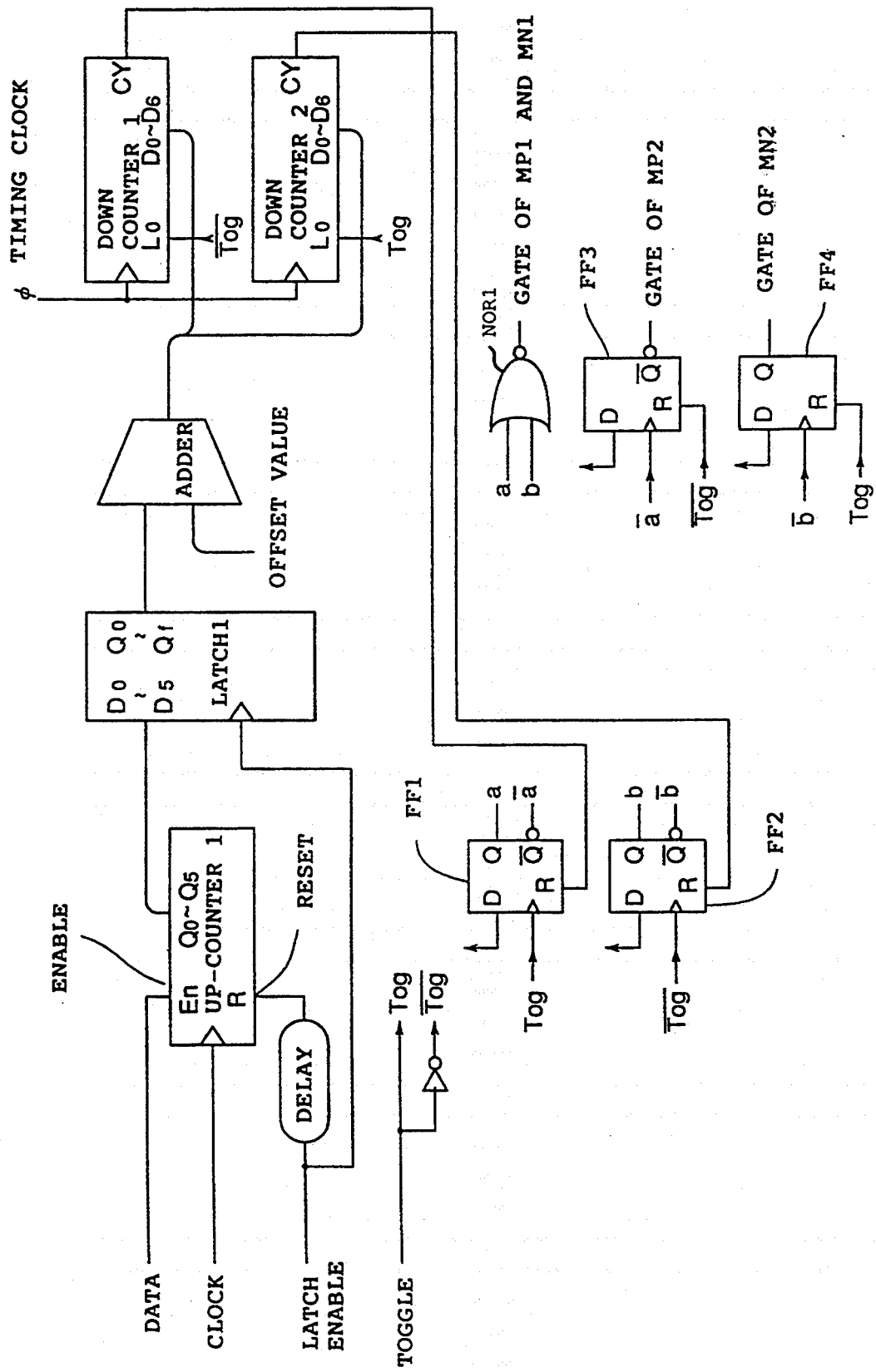
FIG. 9 is a block diagram of a control circuit for a novel energy recovery driver circuit illustrated in FIG. 7.
Figure 10:
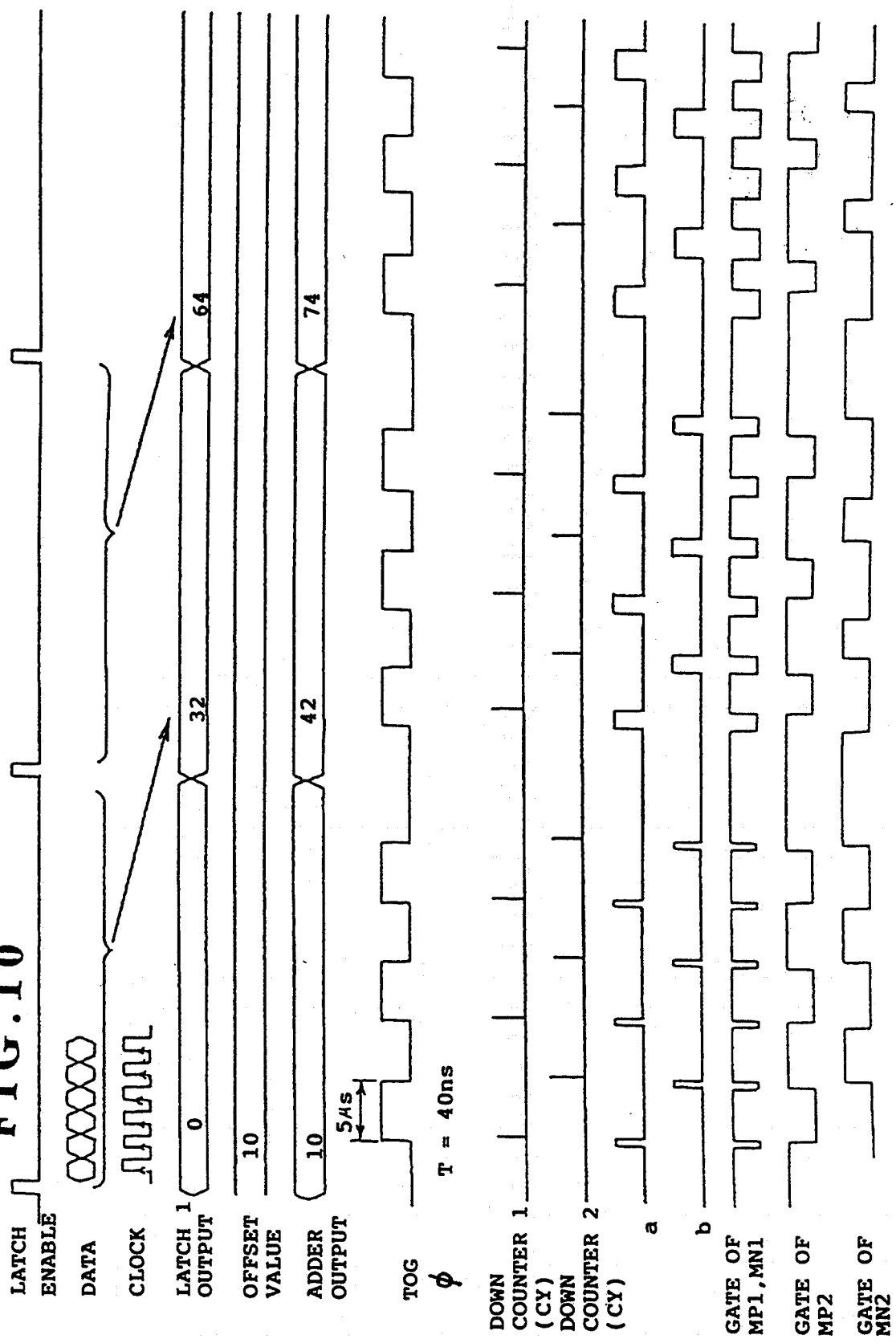
FIG. 10 is a timing charge illustrative of wave-forms of a control circuit illustrated in FIG. 9.

The circuit structure of the control unit is illustrated in FIG. 9. The control unit comprises logic circuits which include an up-counter, a latch circuit 1 and an adder as well as two down counters 1 and 2. The up-counter 1 receives the identical data signal and clock signal as those supplied to the driver integrated circuit 21 and then performs the counting-up operation of the number of the current selected output terminals in the driver integrated circuit 21. The count value about the number of the selected output terminals is supplied to the latch circuit for storage therein, and then supplied to the adder for being added with offset values which means the reflected values from the parasitic capacitance of the circuits when no output terminal is selected in the driver integrated circuit 21. The added value is further supplied to both the down counters 1 and 2. Flip-flop circuits FF1 and FF2 receive a toggle signal having a high voltage pulse signal wave-form and an inverted signal thereof. The flip-flop circuits FF1 and FF2 respectively receive high level and low level signals and then set outputs "a" and "b" thereby the down counters 1 and 2 are activated respectively. The outputs a and b are connected to inputs of a NOR gate NOR1. The output of NOR1 controls the gates of MP1 and MN1. The added values inputted into the down counters 1 and 2 are counted thereby and then are reset. That is how the control unit 22 determines the output timing of the low power driver circuit by replacing the number of the selected output terminals in the driver integrated circuit by the above output timing. The above mentioned operations are performed according to the timing illustrated in FIG. 10.

From the above descriptions, it is understood that the preferred embodiment of the present invention provides the novel circuit configuration of the low power driver circuit comprising the novel energy recovery driver circuit and the driver integrated circuit for the AC plasma display device. The above circuit configuration allows the single energy recovery driver circuit to drive the plural terminals connected to the pixel capacitors in the plasma display panel. Since such a circuit configuration provided by the present invention requires only a single energy recovery driver circuit, a considerable cost savings is obtained. The control unit is able to so control the output timing of the energy recovery driver circuit according to the display pattern of the plasma display panel, resulting in that the circuit is free from any unnecessary parasitic capacitance. The invention therefore provides an inexpensive and an extremely low power driver circuit for AC plasma display devices.

Whereas modifications of the present invention will no doubt be apparent to a person having ordinary skill in the art, to which the invention pertains, it is to be understood that the embodiments shown and described by way of illustrations are by no means intended to be considered in a limiting sense. Accordingly, it is to be intended to cover by claims all modifications which fall within the spirit and scope of the invention.

What is claimed is:

1. A driver circuit for driving an AC plasma display device comprising:
   an output terminal connected to an external load capacitance in said plasma display device for delivering an output of said driver circuit to said load capacitance;
   a voltage sustaining means connected to said output terminal for sustaining voltages appearing at said output terminal;
   an inductor means comprising first and second terminals, said first terminal being connected in series to said output terminal for recovering most of energies normally lost in charging and discharging said load capacitor;
   a two-way switching means comprising only first and second MOS transistors connected in series to each other, said first MOS transistor being connected to said second terminal of said inductor means, said two-way switching means controlling switching operations in charging and discharging said load capacitance;
   an AC power supply means connected to said second MOS transistor of said two-way switching means for supplying an alternating current for charging and discharging said load capacitance; and
   a control circuit means connected to said two-way switching means for controlling said switching operations of said two-way switching means.

2. The driver circuit as claimed in claim 1, wherein said first and second MOS transistors of said two-way switching means are connected in series through their source terminals to each other.

3. The driver circuit as claimed in claim 1, wherein said MOS transistors of said two way switching means comprise n-channel MOS transistors.

4. The driver circuit as claimed in claim 1, wherein said AC power supply means comprises a capacitor having a greater capacitance than said load capacitance.

5. The driver circuit as claimed in claim 4, wherein said control circuit means comprises:
   a DC power supply connected at its minus side to said capacitor; and
   a CMOS transistor connected in series between a plus side of said DC power supply and a ground line, said CMOS transistor comprising a pair of p-channel and n-channel MOS transistors being connected in series to each other through those drain terminals, said drain terminals being connected to gate terminals of said MOS transistors of said two way switching means.

6. The driver circuit as claimed in claim 5, further comprising a pair of Zener diodes connected to each other through their input sides, said pair of Zener diodes being connected between said gate terminals and said source terminals of said MOS transistors of said two way switching means.

7. A driver circuit for driving an AC plasma display device in which said driver circuit is connected at its output terminal to a high voltage power terminal of a driver integrated circuit having a plurality of output terminals connected to data lines in a display panel, said driver circuit comprising:
   a voltage sustaining means connected to said output terminal for sustaining voltages appearing at said output terminal;
   an inductor means comprising first and second terminals, said first terminal being connected in series to said output terminal for recovering most of energies normally lost in charging and discharging a load capacitor connected to said output terminal;
   a two-way switching means comprising only first and second MOS transistors connected in series to each other, said first MOS transistor being connected to said second terminal of said inductor means, said two-way switching means controlling switching operations in charging and discharging said load capacitance;
   an AC power supply means connected to said second MOS transistor of said two-way switching means for supplying an alternating current for charging and discharging said load capacitance; and
   a control circuit means connected to said two-way switching means for controlling said switching operations of said two-way switching means.

8. The driver circuit as claimed in claim 7, wherein said first and second MOS transistors of said two way switching means are connected in series through their source terminals to each other.

9. The driver circuit as claimed in claim 7, wherein said MOS transistors of said two way switching means comprise n-channel MOS transistors.

10. The driver circuit as claimed in claim 7, wherein said AC power supply means comprises a capacitor having a greater capacitance than said load capacitance.

11. The driver circuit as claimed in claim 10, wherein said control circuit means comprises:
    a DC power supply connected at its minus side to said capacitor; and
    a CMOS transistor connected in series between a plus side of said DC power supply and a ground line, said CMOS transistor comprising a pair of p-channel and n-channel MOS transistors connected in series to each other through their drain terminals, said drain terminals being connected to gate terminals of said MOS transistors of said two way switching means.

12. The driver circuit as claimed in claim 11, further comprising a pair of Zener diodes connected to each other through their input sides, said pair of Zener diodes being connected between said gate terminals and said source terminals of said MOS transistors of said two way switching means.

* * * * *